(12) United States Patent
Tsai et al.

(10) Patent No.: US 10,720,751 B2
(45) Date of Patent: Jul. 21, 2020

(54) OPTICAL PACKAGE STRUCTURE, OPTICAL MODULE, AND METHOD FOR MANUFACTURING THE SAME

(71) Applicant: Advanced Semiconductor Engineering, Inc., Kaohsiung (TW)

(72) Inventors: Yu-Hsuan Tsai, Kaohsiung (TW); Lu-Ming Lai, Kaohsiung (TW); Ying-Chung Chen, Kaohsiung (TW); Shih-Chieh Tang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/118,228

(22) Filed: Aug. 30, 2018

(65) Prior Publication Data

US 2019/0097387 A1  Mar. 28, 2019

Related U.S. Application Data

(60) Provisional application No. 62/564,130, filed on Sep. 27, 2017.

(51) Int. Cl.
*G02B 6/02* (2006.01)
*H04B 10/50* (2013.01)
(Continued)

(52) U.S. Cl.
CPC ...... *H01S 5/02268* (2013.01); *H01L 23/5385* (2013.01); *H01L 24/32* (2013.01); *H01L 24/83* (2013.01); *H01L 31/0203* (2013.01); *H01L 33/483* (2013.01); *H01L 33/486* (2013.01); *H01L 33/62* (2013.01); *H01S 5/0216* (2013.01); *H01S 5/0226* (2013.01); *H01S 5/02208* (2013.01); *H01S 5/02236* (2013.01); *H01S 5/02272* (2013.01); *H01S 5/4025* (2013.01); *H01L 23/5384* (2013.01); *H01L 23/5386* (2013.01); *H01L 25/042* (2013.01); *H01L 25/0753* (2013.01); *H01L 25/167* (2013.01); *H01L 31/02002* (2013.01);
(Continued)

(58) Field of Classification Search
CPC .......... H01L 25/167; H01L 2924/0002; H01L 2924/00; G02B 6/4238; G02B 6/4269; G02B 6/4274; G02B 6/4214; G02B 6/4206; H01S 5/0071; H01S 5/0261; H01S 5/02469; H01S 5/02248; H01S 5/021; H01S 5/0224
See application file for complete search history.

(56) References Cited

U.S. PATENT DOCUMENTS

2005/0248909 A1\* 11/2005 Kikuchi .................. H01C 1/06
361/309
2006/0108676 A1\* 5/2006 Punzalan, Jr. .... H01L 23/49805
257/686

(Continued)

*Primary Examiner* — Brian Turner
(74) *Attorney, Agent, or Firm* — Foley & Lardner LLP

(57) ABSTRACT

An optical package structure includes a substrate having a first surface, an interposer bonded to the first surface through a bonding layer, the interposer having a first area from a top view perspective, and an optical device on the interposer, having a second area from the top view perspective, the first area being greater than the second area. A method for manufacturing the optical package structure is also provided.

21 Claims, 13 Drawing Sheets

(51) Int. Cl.

| | |
|---|---|
| *G02B 6/35* | (2006.01) |
| *G02B 6/42* | (2006.01) |
| *H04B 10/80* | (2013.01) |
| *H01S 5/022* | (2006.01) |
| *H01L 31/0203* | (2014.01) |
| *H01L 33/62* | (2010.01) |
| *H01L 23/00* | (2006.01) |
| *H01L 23/538* | (2006.01) |
| *H01S 5/40* | (2006.01) |
| *H01L 33/48* | (2010.01) |
| *H01S 5/02* | (2006.01) |
| *H01L 25/075* | (2006.01) |
| *H01S 5/183* | (2006.01) |
| *H01L 25/04* | (2014.01) |
| *H01L 31/02* | (2006.01) |
| *H01L 25/16* | (2006.01) |

(52) U.S. Cl.
CPC ............... *H01L 2224/29084* (2013.01); *H01L 2224/29124* (2013.01); *H01L 2224/29138* (2013.01); *H01L 2224/29144* (2013.01); *H01L 2224/29155* (2013.01); *H01L 2224/29166* (2013.01); *H01L 2224/29169* (2013.01); *H01L 2224/83815* (2013.01); *H01L 2924/01014* (2013.01); *H01L 2924/01032* (2013.01); *H01L 2924/01322* (2013.01); *H01L 2924/12041* (2013.01); *H01L 2924/12042* (2013.01); *H01L 2924/40503* (2013.01); *H01L 2933/0033* (2013.01); *H01L 2933/0066* (2013.01); *H01S 5/02248* (2013.01); *H01S 5/183* (2013.01)

(56) References Cited

U.S. PATENT DOCUMENTS

| | | | |
|---|---|---|---|
| 2007/0057271 A1* | 3/2007 | Schiaffino | H01L 33/0095 257/99 |
| 2013/0216177 A1* | 8/2013 | Tseng | G02B 6/12004 385/14 |
| 2015/0340346 A1* | 11/2015 | Chu | H01L 25/0753 257/89 |
| 2016/0167951 A1* | 6/2016 | Goida | B81B 7/0074 257/738 |
| 2017/0148955 A1* | 5/2017 | Wu | H01L 25/167 |
| 2018/0045882 A1* | 2/2018 | Chojnacki | G02B 6/0081 |

* cited by examiner

OPTICAL PACKAGE STRUCTURE, OPTICAL MODULE, AND METHOD FOR MANUFACTURING THE SAME

CROSS-REFERENCE TO RELATED APPLICATION

This application claims the benefit of and priority to U.S. Provisional Application No. 62/564,130, filed Sep. 27, 2017, the contents of which are incorporated herein by reference in their entirety.

BACKGROUND

In an optical system (e.g., a light scanning sensor, distance finding sensor, or background-light sensing system), light emitting diodes (LED) and/or light detectors are used. Alignment of the optical devices is important since the optical axes of an optical device can be greatly affected by misalignment. It is therefore desirable to have a package structure and corresponding method that reduce the misalignment of optical devices in various applications.

SUMMARY

Some embodiments of the present disclosure provide an optical package structure, including a substrate having a first surface, an interposer bonded to the first surface through a bonding layer, the interposer having a first area from a top view perspective, and an optical device on the interposer, the optical device having a second area from the top view perspective. The first area is greater than the second area.

Some embodiments of the present disclosure provide an optical module, including a ceramic substrate, a silicon interposer on the ceramic substrate, a bonding layer between the ceramic substrate and the silicon interposer, and an optical device disposed on and electrically connected to the silicon interposer. The bonding layer includes a first thickness at one end of the interposer and a second thickness at an opposite end of the interposer, the first thickness being different from the second thickness.

Some embodiments of the present disclosure provide a method for manufacturing an optical package structure, including providing an interposer, the interposer having a bond pad on a front surface, placing an optical device on the front surface of the interposer, the optical device having a bonding surface with eutectic alloys, illuminating, by a light source, the eutectic alloys to bond the optical device to the interposer, and joining the interposer and a substrate through a bonding layer.

BRIEF DESCRIPTION OF THE DRAWINGS

Aspects of the present disclosure are best understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1:
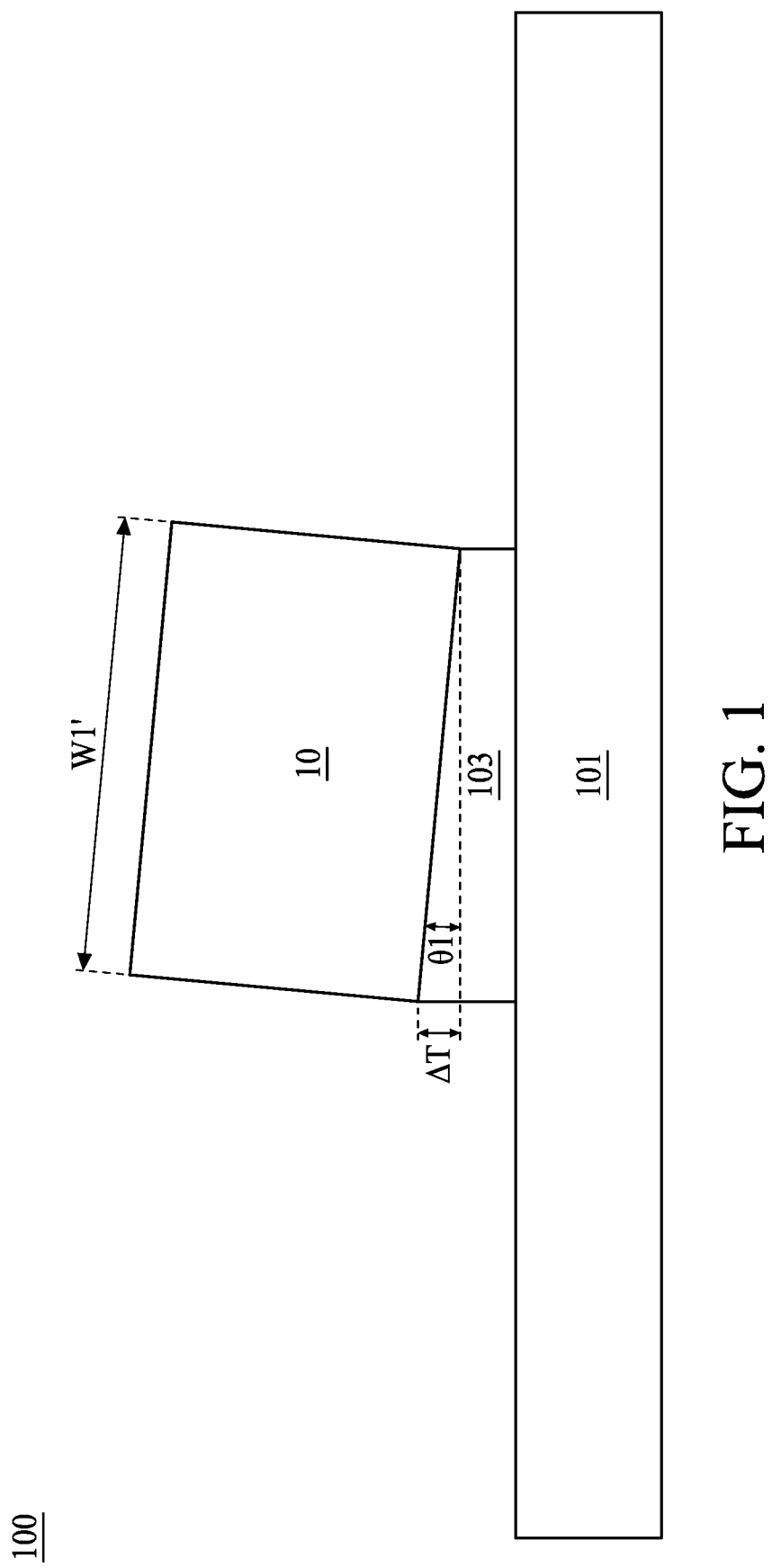
FIG. 1 is a cross-sectional view of an optical system.

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (e.g., rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

The numerical ranges and parameters setting forth the broad scope of the disclosure may be approximations, and the numerical values set forth in the specific examples may be reported as precisely as possible. Some numerical values, however, may contain certain errors resulting from the standard deviation found in the respective testing measurements. Also, as used herein, the term "about" generally means within ±10%, ±5%, ±1%, or ±0.5% of a given value or range. Other than in the operating/working examples, or unless otherwise expressly specified, numerical ranges, amounts, values and percentages such as those for quantities of materials, durations of times, temperatures, operating conditions, ratios of amounts, and the likes thereof disclosed herein may be modified in all instances by the term "about." Accordingly, unless indicated to the contrary, the numerical parameters set forth in the present disclosure and attached claims may be approximations that can vary. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

During the process for manufacturing an optical system including a substrate and an optical device disposed thereon, the optical device is attached to the substrate by an adhesive, such as glue, solder paste, gel-type adhesive, film-type adhesive or other suitable bonding materials. After the adhesive is cured, the volume or shape of the adhesive may be altered because the molecular bonds of the material are changed. Hence, the optical device may be tilted, shifted or rotated, which affects the desired optical path. Such phenomenon may affect optical performance (e.g. sensing accuracy) of the optical system.

FIG. 1 is a cross-sectional view of an optical system 100. The optical system 100 includes an optical device 10, e.g. a laser diode (LD), a light emitting diode (LED), a vertical-cavity surface-emitting laser (VCSEL) diode, an edge emitting laser diode, other illuminating components or an optical receiver, and a substrate 101. The optical device 10 is disposed or attached to the substrate by an adhesive 103, such as glue, gel-type adhesive, film-type adhesive or other suitable bonding materials. In some embodiments, the substrate 101 is a ceramic substrate for high reliability applications (e.g., automobile electronic products). The ceramic substrate 101 blocks infrared light or light within or close to the infrared waveband.

During the process for manufacturing the optical device 10 in FIG. 1, for example, an LD is bonded to the ceramic substrate 101 by the glue 103. After the glue 103 is cured, the volume or shape of the glue 103 might be changed because the molecular bonds of the material have been changed. Hence, the LD may be tilted, shifted or rotated, which affects the optical axes along the optical path of the LD. Such phenomenon may affect optical performance (e.g. sensing accuracy) of the optical system 100. Take the optical system 100 in FIG. 1 for example, for an optical device 10 having a width W1' of 0.4 mm, and suppose a tilting measurement, namely a height difference ΔT between the left side and the right side of the glue 103, conducted on the optical device 10, is about 25 wherein the optical device 10 can have a tiling angle θ1 of less than 3.585 degrees. Since the orientation of the optical device 10 is susceptible to change as a result of the volume variation of the glue 103 after the curing operation, the optical device 10 is frequently found to be tilted, shifted, or rotated from the original orientation.

As a result of volume variation of the adhesive layer of glue 103, tilting angle or rotational angle of the optical device 10 is one of critical issues for an optical system because a tiny tilting angle proportional to the length of the optical path may cause a relatively large light deviation. In some embodiments, tolerance of an out-of-plane tilting angle of the optical device 10 is less than 0.5 degrees. In some embodiments, tolerance of an in-plane rotation angle of the optical device 10 is less than 1 degree. Displacement of the optical device 10 is one of critical issues for an optical system because undesired displacements of optical devices may change the original optical path design. In some embodiments, tolerance of the optical device 10 displacement in y/z direction and x direction are within +/−10 μm and +/−20 μm, respectively. Therefore, as shown in FIG. 1, the tilting angle (e.g., 3.585 degrees) of the optical device 10 may exceed the tolerance of the tilting angle (e.g., 0.5 degree).

Figure 2A:
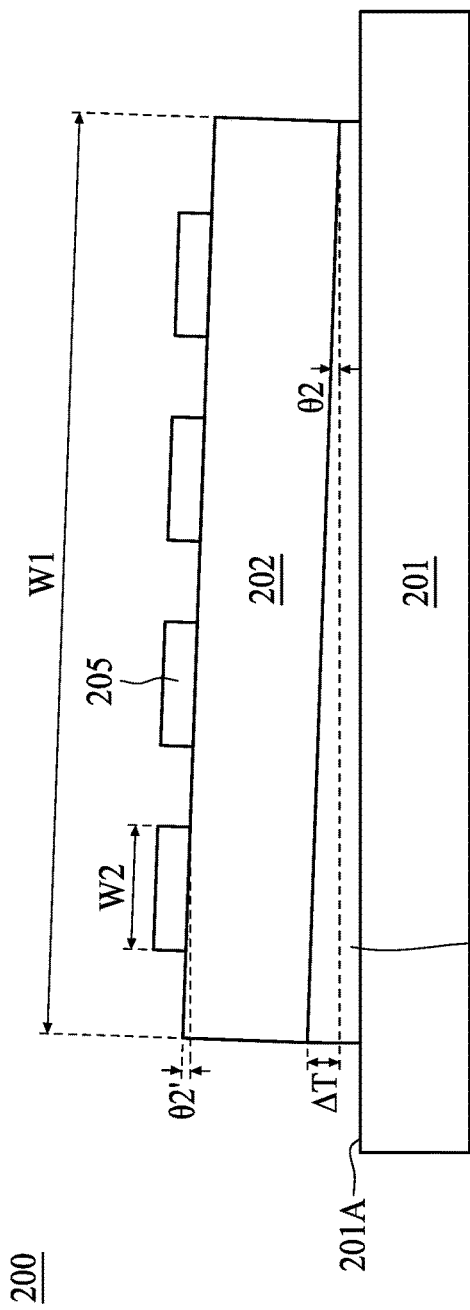
FIG. 2A is a cross-sectional view of an optical system 200 in accordance with some embodiments of the present disclosure.

Referring to FIG. 2A, FIG. 2A is a cross-sectional view of an optical system 200 in accordance with some embodiments of the present disclosure. The optical device in FIG. 2 includes an LD 205, an interposer 202 and a substrate 201. The interposer 202 and the LD 205 are positioned on a first surface 201A of the substrate 201.

The LD 205 may be replaced by an LED, a VCSEL or another optical device that may include one or more semiconductor layers. The semiconductor layers may include silicon, silicon carbide, gallium nitride, or any other semiconductor material. The LD 205 is disposed on the interposer 202. In some embodiments, the interposer 202 comprises silicon. The interposer 202 may include an interconnection structure, such as a plurality of conductive traces (e.g., redistribution layer), pads and/or through vias. The interposer 202 is disposed or attached to the substrate 201 by an adhesive layer 203, such as glue. In some embodiments, the substrate 201 is a ceramic substrate for high reliability applications.

As mentioned above, during the curing process, the volume or shape of the adhesive layer 203 might change because the molecular bonds of the material have been changed. As a result, a tilt, shift, or rotation of the interposer 202 may occur. In the optical system 200 in FIG. 2A, for example, a tilting tolerance is pre-determined at 25 μm, meaning that the height difference ΔT between the left side of the interposer and the right side of the interposer should be smaller than about 25 μm. Alternatively, the height difference ΔT is measured by a width of the interposer 202 times sin(θ2), wherein θ2 is the tilting angle of the interposer 202 with respect to the substrate 201. Assuming that a width W1 of the interposer 202 is about 10 mm, the tilting angle θ2 of the interposer 202 should be less than about 0.0143 degrees. By disposing the LD 205 on a relatively larger or wider interposer 202 and then attaching the interposer 202 to the substrate 201, the tilting angle θ2' of the LD 205 with respect to the first surface 201A of the substrate 201 becomes much smaller than the tilting angle θ1 of the optical device 10 in FIG. 1, which is directly attached to the substrate 101 with an identical adhesive layer. Relative tilting between the LD 205 and the interposer 202 is rather constrained, as will be later discussed in FIG. 3 of the present disclosure. The reduction of the tilting angles θ2 and θ2' can be attributed to the relatively larger or wider interposer 202, which has an orientation that is less susceptible to change as a result of the volume variation of the adhesive layer 203 after the curing operation. Therefore, the tilting angle θ2 of the interposer 202, and thus the tilting angle θ2' of the LD 205, can be effectively reduced. In some embodiments, the adhesive layer 203 includes flowable adhesive such as glue. In some embodiments, the adhesive layer 203 includes solder paste.

As mentioned above, the tilting angle θ2' of the LD is one of critical issues of an optical system because a tiny tilting angle may cause a relatively large light deviation. In addition, in a high accuracy inertial motion unit (IMU) with small die size, it is challenging to control the die bonding accuracy. In accordance with some embodiments in FIG. 2A, by disposing the LD 205 on the relatively larger or wider interposer 202 and then attaching the interposer 202 to the substrate 201, the tilting angle θ2' of the LD 205 can be reduced by the introduction of the interposer 202 compared to the case where no interposer 202 is introduced. Reducing the tilting angle of the LD 02' increases the accuracy of an IMU.

Figure 2B:
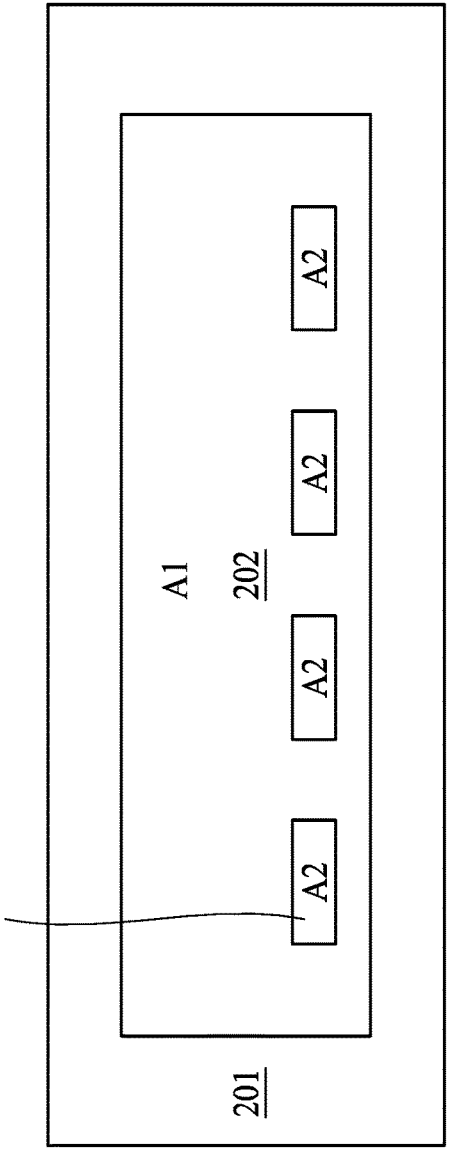
FIG. 2B is a top view of the optical system 200 of FIG. 2A, in accordance with some embodiments of the present disclosure.

Referring to FIG. 2B, FIG. 2B is a top view of the optical system 200 of FIG. 2A. The interposer 202 disposed over the substrate 201 has a first area A1 from a top view perspective. Each of the plurality of LDs 205 disposed over the interposer 202 has a second area A2 from a top view perspective. The first area A1 is greater than the second area A2. Alternatively, a width W1 of the interposer 202 is wider than a width W2 of the LD 205 from a cross-sectional view perspective.

Figure 3:
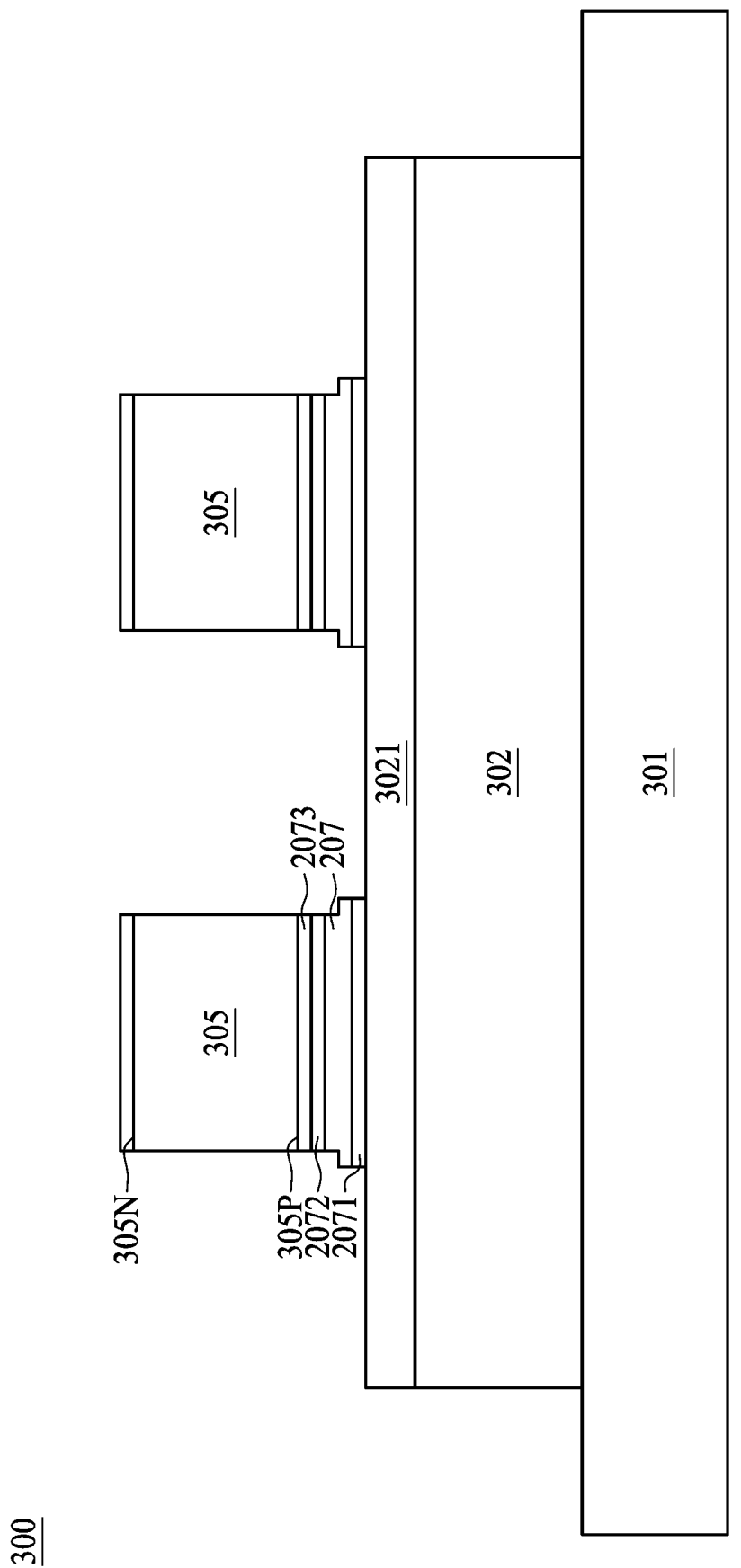
FIG. 3 is a cross-sectional view of an optical system 300, in accordance with some embodiments of the present disclosure.

FIG. 3 is a cross-sectional view of an optical system 300, in accordance with some embodiments of the present disclosure. Various figures have been simplified for a better understanding of the aspects of the present disclosure.

Referring to FIG. 3, an interposer 302 is provided over a substrate 301. In some embodiments, the interposer 302 is a silicon interposer, through which infrared light is transparent. The interposer 302 may include an interconnect structure, such as a plurality of conductive traces (e.g., redistribution layer), pads and/or through vias. In some embodiments, a protection layer 3021 (e.g., a passivation layer, an insulation layer or an oxide layer) is disposed on the interposer 3021 to cover a portion of the top surface of the interposer 3021 and to expose electrical connections (e.g., conductive pads) on the interposer 3021. In some embodiments, the conductive pads may include an adhesion layer 2071, for example, titanium (Ti), and a conductive layer 207, for example, gold (Au) or eutectic compound such as gold-tin (AuSn).

In some embodiments, the conductive layer 207 of the conductive pad may include other eutectic compounds having a eutectic temperature of more than 260 degrees Celsius. For example, gold-germanium (AuGe), gold-silicon (AuSi), aluminum-germanium (AlGe), aluminum-silicon (AlSi) or the like can be adopted as the conductive layer 207. Having a eutectic temperature greater than 260 degrees Celsius helps prevent the conductive layer 207 from melting in subsequent solder reflow operations.

The LD 305 is then disposed on the interposer 302 and electrically connected to the interposer 302. For example, an electrical contact of the LD 305 is aligned with and electrically connected to the conductive pad on the interposer 302. In some embodiments, the LD 305 is disposed on the interposer 302 by pick-and-place technique. In some embodiments, the electrical contact of the LD 305 may include an adhesion layer 2073, for example titanium (Ti), a barrier layer 2072, for example platinum (Pt) or nickel (Ni), and a conductive layer 207 for example, gold (Au) or eutectic compound such as gold-tin (AuSn).

In some embodiments, the conductive layer 207 of the electrical contact may include other eutectic compounds having a eutectic temperature of more than 260 degrees Celsius. For example, gold-germanium (AuGe), gold-silicon (AuSi), aluminum-germanium (AlGe), aluminum-silicon (AlSi) or the like can be adopted as the conductive layer 207. Having a eutectic temperature greater than 260 degrees Celsius helps prevent the conductive layer 207 from melting in subsequent solder reflow operations.

The LD 305 includes a p-type electrode 305P facing toward the interposer 302 and an n-type electrode 305N opposite to the p-type electrode 305P. In some embodiments, the p-type electrode 305P is an epitaxial layer and the light is emitted from an edge of the p-type electrode 305P. By placing the LD 305 with the p-type electrode 305P facing toward the interposer 302, it is easier to control the displacement, tilt, or rotation of the LD 305 because the epitaxial layer has better surface roughness uniformity compared with the n-type electrode 305N of the LD. It is accepted that the surface roughness uniformity at the n-type electrode 305N of the LD 305 is relatively less due to thinning/grinding operations in the manufacturing process.

Referring to FIG. 3, the electrical contacts of the LD 305 are bonded to the corresponding conductive pad on the interposer 302 by, for example, laser welding, fusing, melting or other suitable bonding techniques. For example, the electrical contacts of the LD 305 and the conductive pads on the interposer 302 form or define a eutectic structure. In some embodiments, the laser welding is carried out by applying an infrared (IR) light source at the conductive layer 207 between the LD 305 and the interposer 302 after the pick and place operation. The IR light source is configured to pass through the silicon interposer 302 without substantial attenuation (or absorption by the silicon interposer 302). By using the laser welding to form a eutectic bonding for the LD 305 and the interposer 302, shift, rotation or tilt of the LD 305 with respect to the interposer 302 is avoided. In some embodiments, after the LD 305 is bonded to the interposer 302, the interposer 302 is attached to a ceramic substrate 301 to form the optical system 300.

In some embodiments, the surface roughness of the ceramic substrate 301 is greater than that of the interposer 302 due to the sintered surface of the ceramic substrate 301. If no interposer 302 is stacked between the LD 305 and the ceramic substrate 301, the significantly rough surface of the ceramic substrate 301 can cause undesired tiling, rotation, or displacement of a surface mount device at a dimension as small as that of the LD 305. Furthermore, the laser welding operation, as previously described, cannot be applied to bond the LD 305 and the ceramic substrate 301 because the ceramic substrate 301 can absorb IR light, namely the IR light source is not transparent to the ceramic substrate 301.

Figure 4:
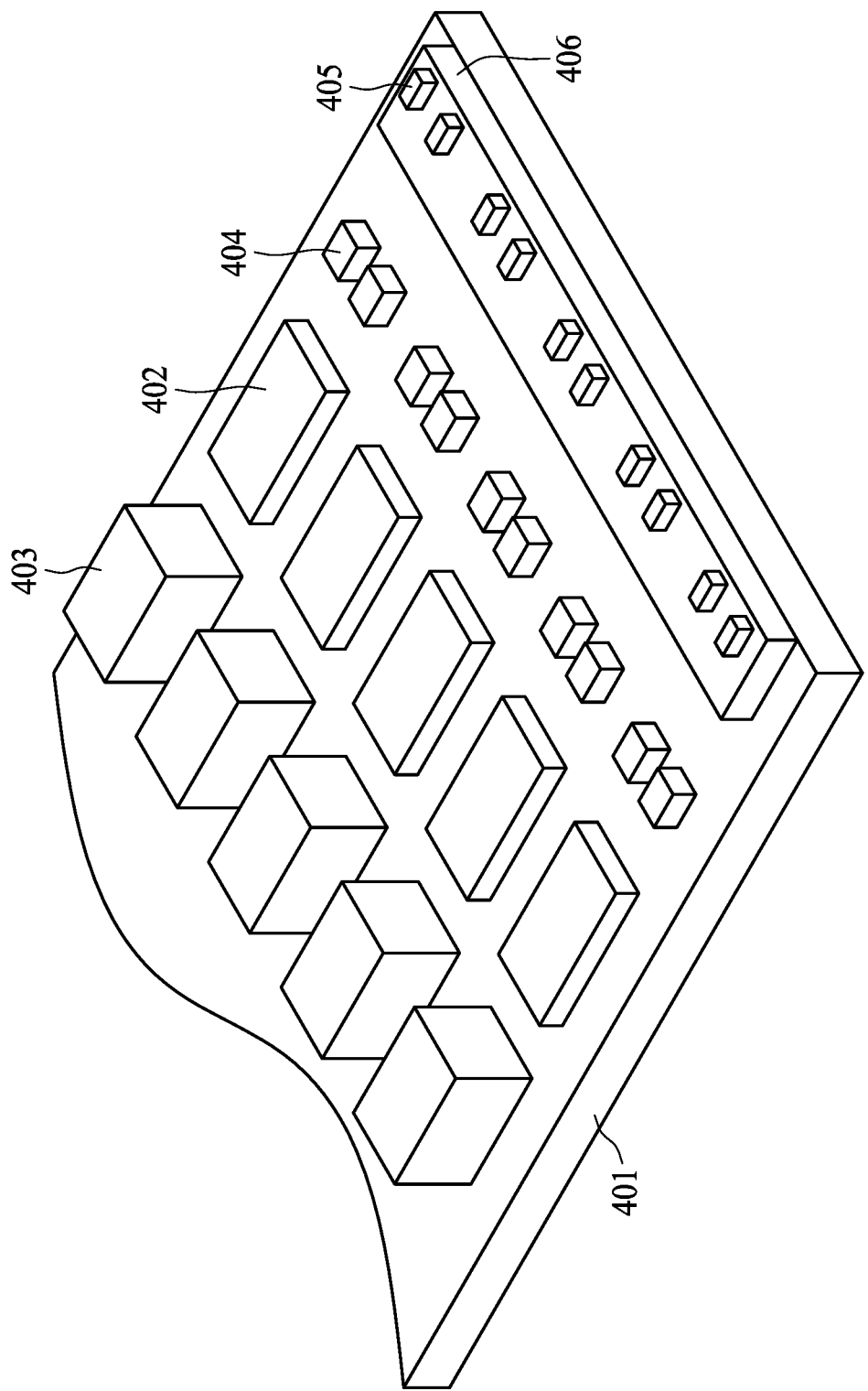
FIG. 4 is a perspective view of an optical system 400, in accordance with some embodiments of the present disclosure.

FIG. 4 illustrates a perspective view of an optical system 400 in accordance with some embodiments of the present disclosure. The optical system 400 in FIG. 4 includes a substrate 401, a silicon interposer 406, active components 402 and 403, passive components 404, and light sources 405. In some embodiments, the silicon interposer 406 may include an interconnect structure, such as a plurality of conductive traces (e.g., redistribution layer), pads and/or through vias. In some embodiments, the active components 402 and 403 may include application-specific integrated circuit (ASIC), field-effect transistor (FET) or other components. In some embodiments, the passive element 404 may include a resistor, a capacitor, an inductor or a combination thereof. In some embodiments, the light source 405 may include LED, LD, VCSEL or other optical components as described above. In some embodiments, the light source 405 can be disposed on the silicon interposer 402 to increase the elevation or altitude of the light source. In some embodiments, the passive components 404 or some of the active components 402 and 403 can also be disposed on the interposer 406, which is then supported by the substrate 401.

Figure 5:
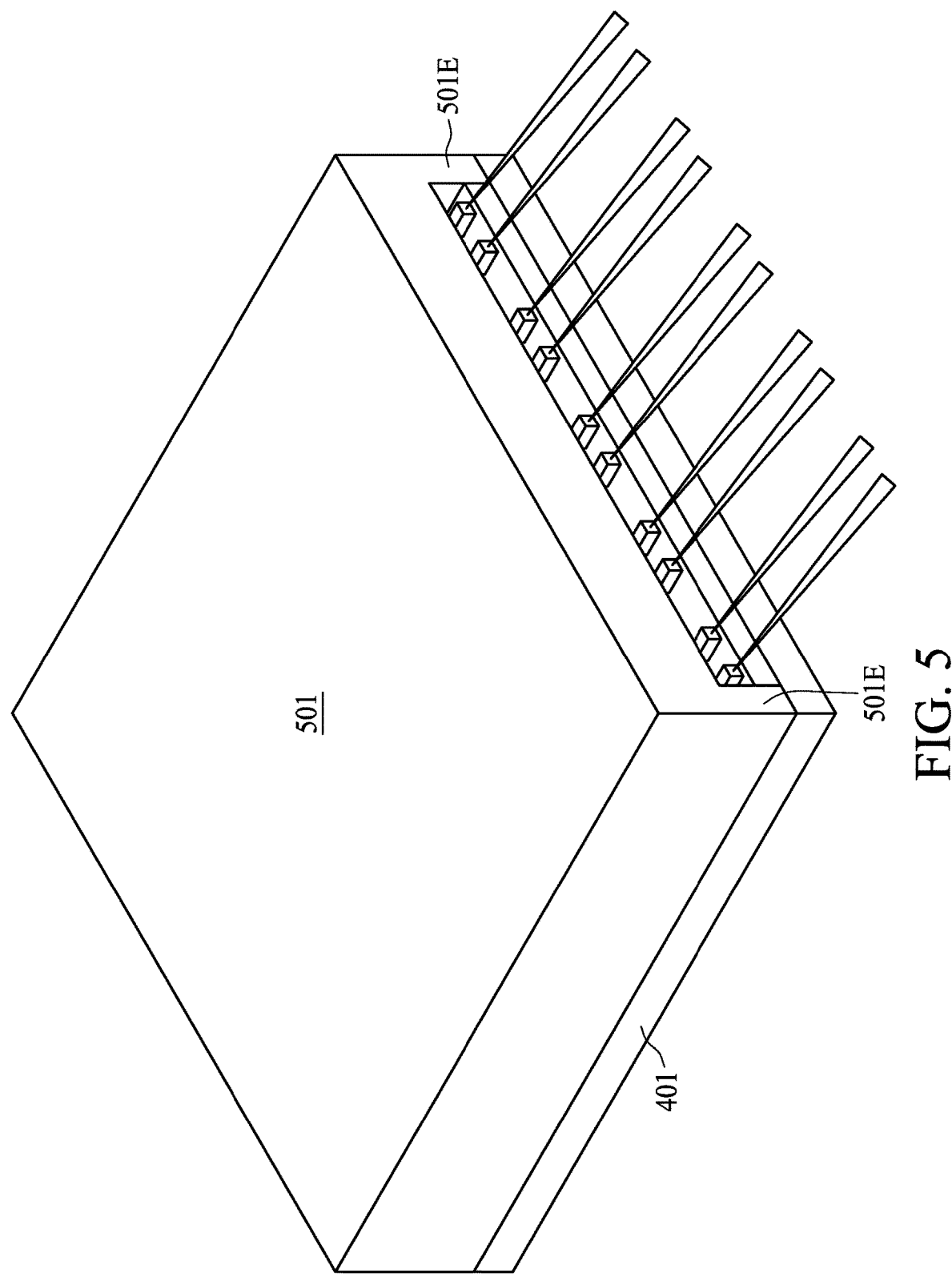
FIG. 5 is a perspective view showing a lid 501 covering the optical system 400 illustrated in FIG. 4.

Referring to FIG. 5, FIG. 5 is a perspective view showing a lid 501 covering the optical system 400 illustrated in FIG. 4. In some embodiments, the lid 501 is a metal lid having an opening on a side surface of the lid 501, preventing the optical path of the light source 405 from being obstructed by the lid 501. In some embodiments, the lid 501 provides extra robustness to the optical system 400 in high reliability applications such as vehicle-carried optical system applications. In some embodiments, the lid 501 provides electromagnetic (EM) shielding to the electronic devices and the optical devices of the optical system 400. For example, the edges 501E of the lid 501 in contact with the substrate 401 are electrically grounded through conductive patterns on the substrate 401. In some embodiments, three edges 501E of the lid 501 are in contact with the conductive patterns of the substrate 401. In some embodiments, the substrate 401 can be composed of ceramic with interconnect structures.

Figure 6:
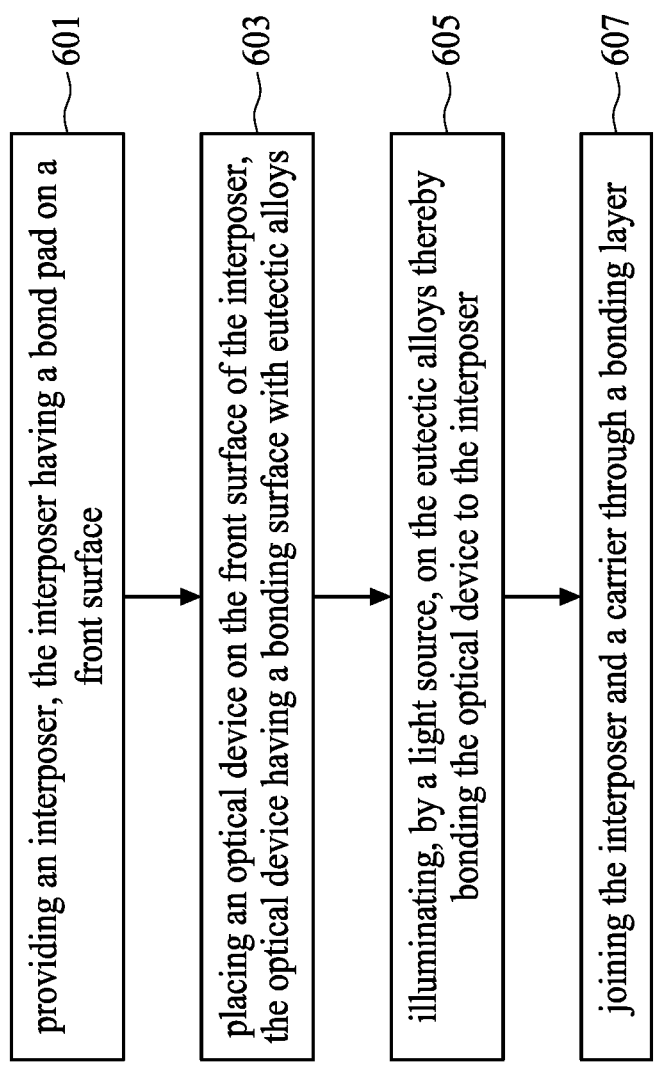
FIG. 6 is an operation flow for manufacturing an optical package structure, in accordance with some embodiments of the present disclosure.

Referring to FIG. 6, FIG. 6 is an operation flow for manufacturing an optical package structure, according to some embodiments of the present disclosure. Operation 601 includes providing an interposer, which has at least a bond pad on a front surface. Operation 603 includes placing an optical device on the front surface of the interposer. The optical device has a bonding surface composed of eutectic alloys. Operation 605 includes illuminating, by a light source, the eutectic alloys to bond the optical device to the interposer. Operation 60 includes joining the interposer and a carrier through a bonding layer. FIG. 7 to FIG. 11 are cross-sectional views or top views of the various operational stages during the manufacturing process.

Figure 7:
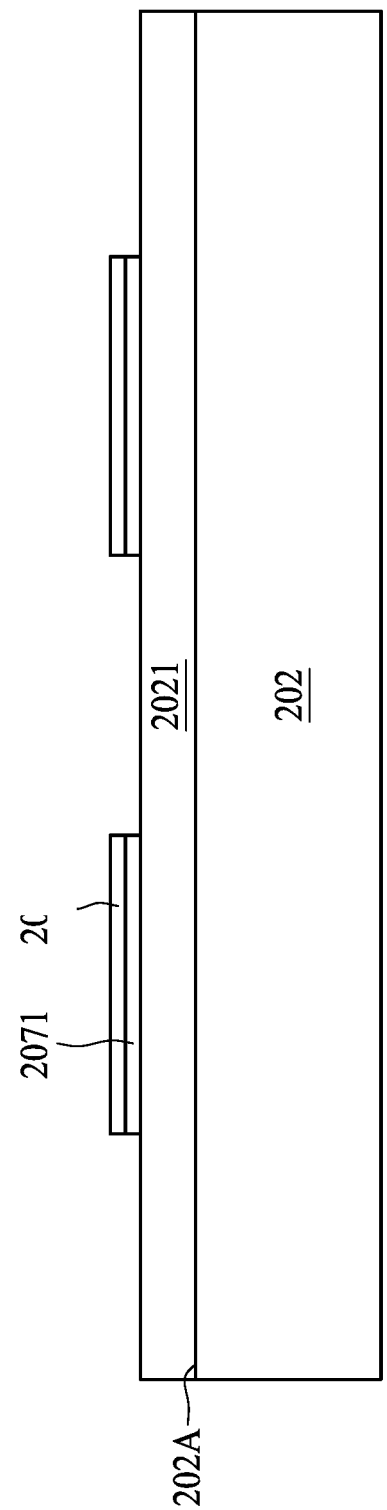
FIG. 7, FIG. 8, FIG. 9, FIG. 10A, FIG. 10B, and FIG. 11 are cross-sectional views or top views of the various operational stages during the manufacturing process, in accordance with some embodiments of the present disclosure.

Referring to FIG. 7, FIG. 7 shows a cross section of an interposer 202 and a plurality of bond pads 207B over a front surface 202A of the interposer 202. In some embodiments, the interposer 202 includes an interconnect structure (not shown in FIG. 7) having conductive metal lines and conductive vias within the interposer 202 and exposed at the front surface 202A of the interposer 202. A protection layer 2021 (e.g., a passivation layer, an insulation layer or an oxide layer) is disposed on the front surface 202A of the interposer and exposes the interconnect structure of the interposer 202; therefore, the interconnect structure and the bond pads 207B are electrically connected. As shown in FIG. 7, an adhesion layer 2071 such as titanium (Ti) is first deposited over the interconnect structure and receives a conductive pad or a bond pad 207B deposited thereon. As previously discussed, the conductive pad or the bond pad 207B includes eutectic compounds having a eutectic temperature of more than 260 degrees Celsius. For example, gold-tin (AuSn), gold-germanium (AuGe), gold-silicon (AuSi), aluminum-germanium (AlGe), aluminum-silicon (AlSi) or the like can be adopted as the bond pad 207B. Having a eutectic temperature greater than 260 degrees Celsius helps prevent the conductive layer 207 bond pad 207B from melting in subsequent solder reflow operations.

Figure 8:
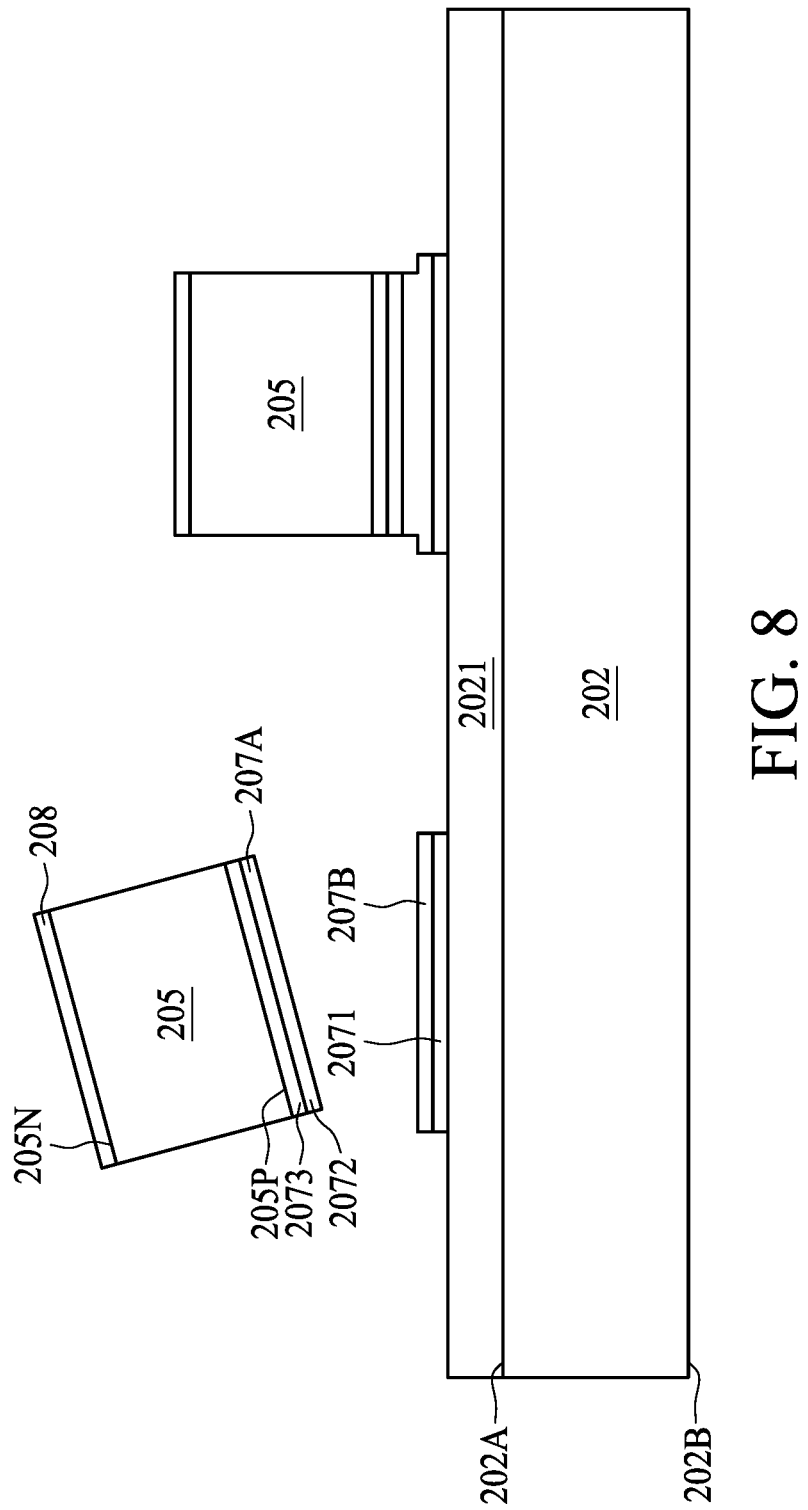

Referring to FIG. 8, FIG. 8 shows a cross section of placing an optical device or laser diode (LD) 205 on the bond pad 207B of the interposer 202. In some embodiments, the optical device or LD 205 is disposed by a pick-and-place operation with multiple optical alignments to minimize displacement error. Once the optical device or laser diode (LD) 205 is positioned at a predetermined location, suction is applied to temporarily fix the optical device or laser diode (LD) 205 while an optical source is illuminated from a back side 202B of the interposer 202 to permanently fix or weld the optical device or laser diode (LD) 205 to the bond pad 207B, as will be further discussed in FIG. 9. Due to the multiple alignments in pick-and-place operation and the suction applied prior to the welding, relative tilting, rotation, or displacement between the optical device or LD 205 and the interposer 202 is rather constrained and thus can be considered negligible. As shown in FIG. 8, the optical device or laser diode (LD) 205 may include a p-type electrode 205P and an n-type electrode 205N opposite to the p-type electrode 205P. An adhesion layer such as titanium (Ti) 2073 and a barrier layer such as platinum (Pt) or nickel (Ni) are disposed at the p-type electrode 205P. In addition, a conductive layer 2072 such as eutectic compounds previously described is disposed at the p-type electrode 205P. In addition, a conductive layer 208 is also disposed at an n-type electrode 205N for subsequent contact formation.

Figure 9:
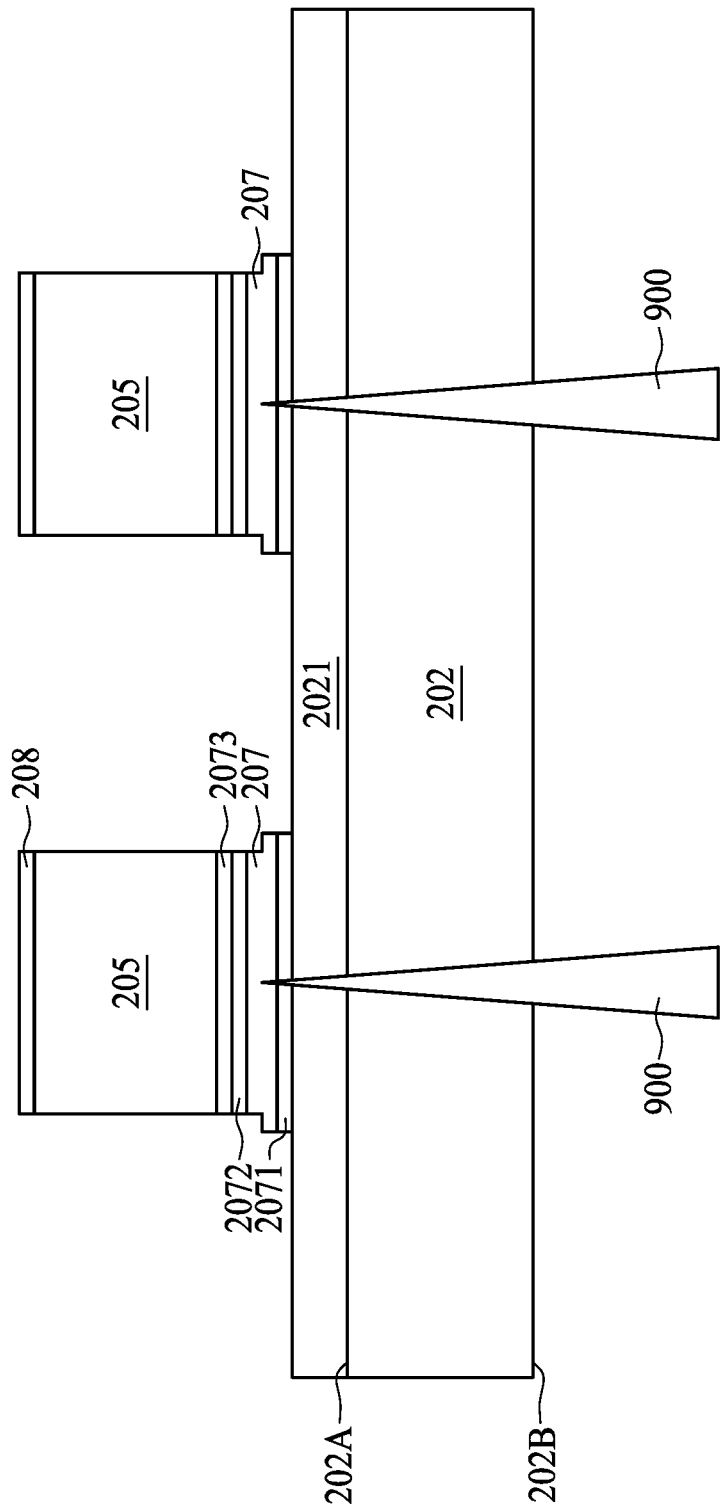

Referring to FIG. 9, FIG. 9 is a cross-sectional view of a laser welding operation in order to permanently fix the optical device or laser diode (LD) 205 to the bond pad 207B of the interposer 202. As previously shown in FIG. 8, the conductive layer 207A and 207B may be composed of eutectic alloys, when an optical source 900, for example, an infrared (IR) laser, illuminates at the back surface 202B of the interposer 202, temperature of the conductive layer 207A and 207B can be raised to exceed the eutectic temperature of the eutectic alloys. In some embodiments, the interposer 202 is composed of silicon, which does not absorb the IR optical source. For example, the conductive layer 207A and 207B can be composed of gold-tin (AuSn). When an infrared (IR) laser illuminates the back surface 202B of the interposer 202, temperature of the AuSn can be raised to surpass the eutectic temperature of 280 degrees Celsius, causing the conductive layer 207A and 207B to melt. Therefore, when the power of infrared (IR) laser is reduced or switched off, the conductive layer 207A and 207B or the AuSn eutectic alloy is solidified and becomes a contiguous conductive layer 207.

In other embodiments, the conductive layer 207A and 207B can include other eutectic alloys having a eutectic temperature greater than 260 degrees Celsius, for example, gold-germanium (AuGe), gold-silicon (AuSi), aluminum-germanium (AlGe), aluminum-silicon (AlSi) or the like. The power of the optical source 900 is controlled to raise the temperature of the conductive layer 207A and 207B to a desired extent that melts the corresponding eutectic alloys.

Figure 10A:
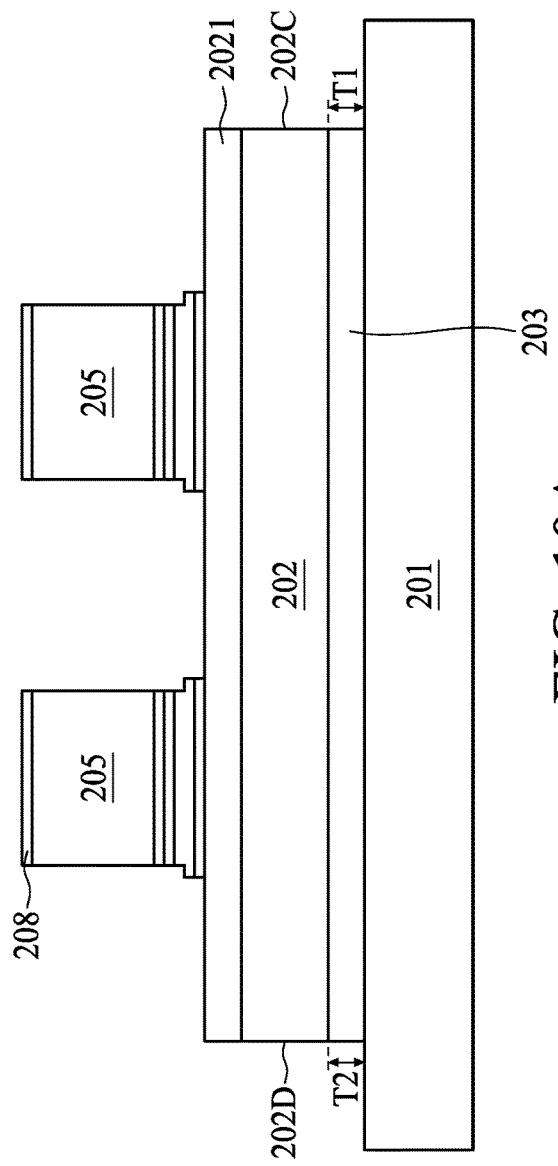
Figure 10B:
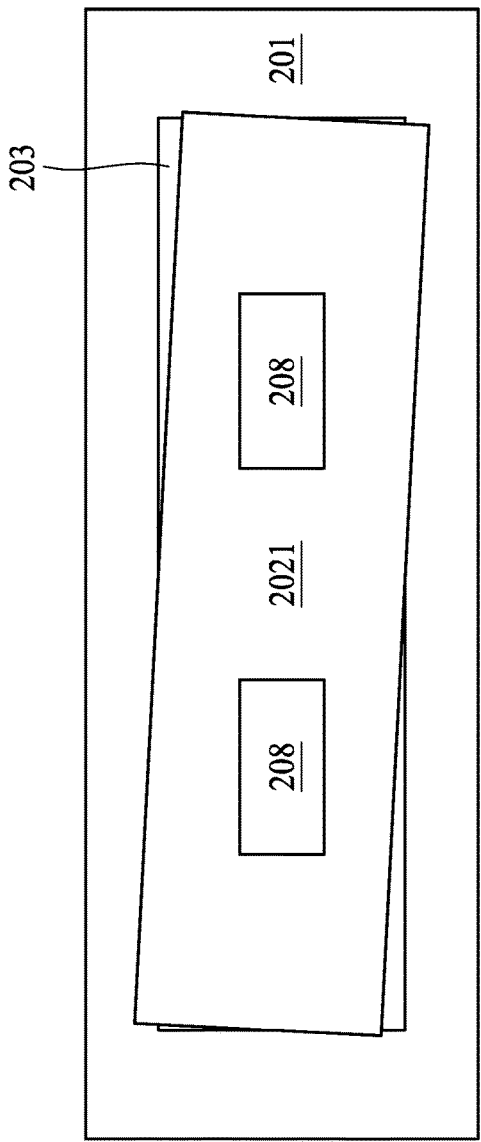

Referring to FIG. 10A and FIG. 10B, FIG. 10A is a cross-sectional view of an optical package structure of FIG. 9 joined to a substrate 201 through a bonding layer 203. FIG. 10B is a top view of the optical package structure of FIG. 10A. In FIG. 10a, the bonding layer 203 can be a glue layer, a polymeric layer, or solder paste. The interposer 202 is disposed over the substrate 201 through a pick-and-place operation, followed by a curing operation to solidify the bonding layer 203. In FIG. 10A, a thickness T1 of the bonding layer 203 at one edge 202C of the interposer 202 and a thickness T2 of the bonding layer 203 at an opposite edge 202D of the interposer 202 are substantially identical, showing that the interposer and the optical devices or LD 205 do not tilt with respect to the substrate 201 after curing of the bonding layer 203.

However, as shown in FIG. 10B, an in-plane rotation of the interposer 202 with respect to the substrate 201 is shown as viewed from a top view perspective. A portion of the underlying bonding layer 203 may be observed due to the rotation of the interposer 202 and the corresponding protection layer 2021. In some embodiments, the in-plane rotation of the interposer 202 with respect to the substrate 201 is less than 1 degree.

Figure 11:
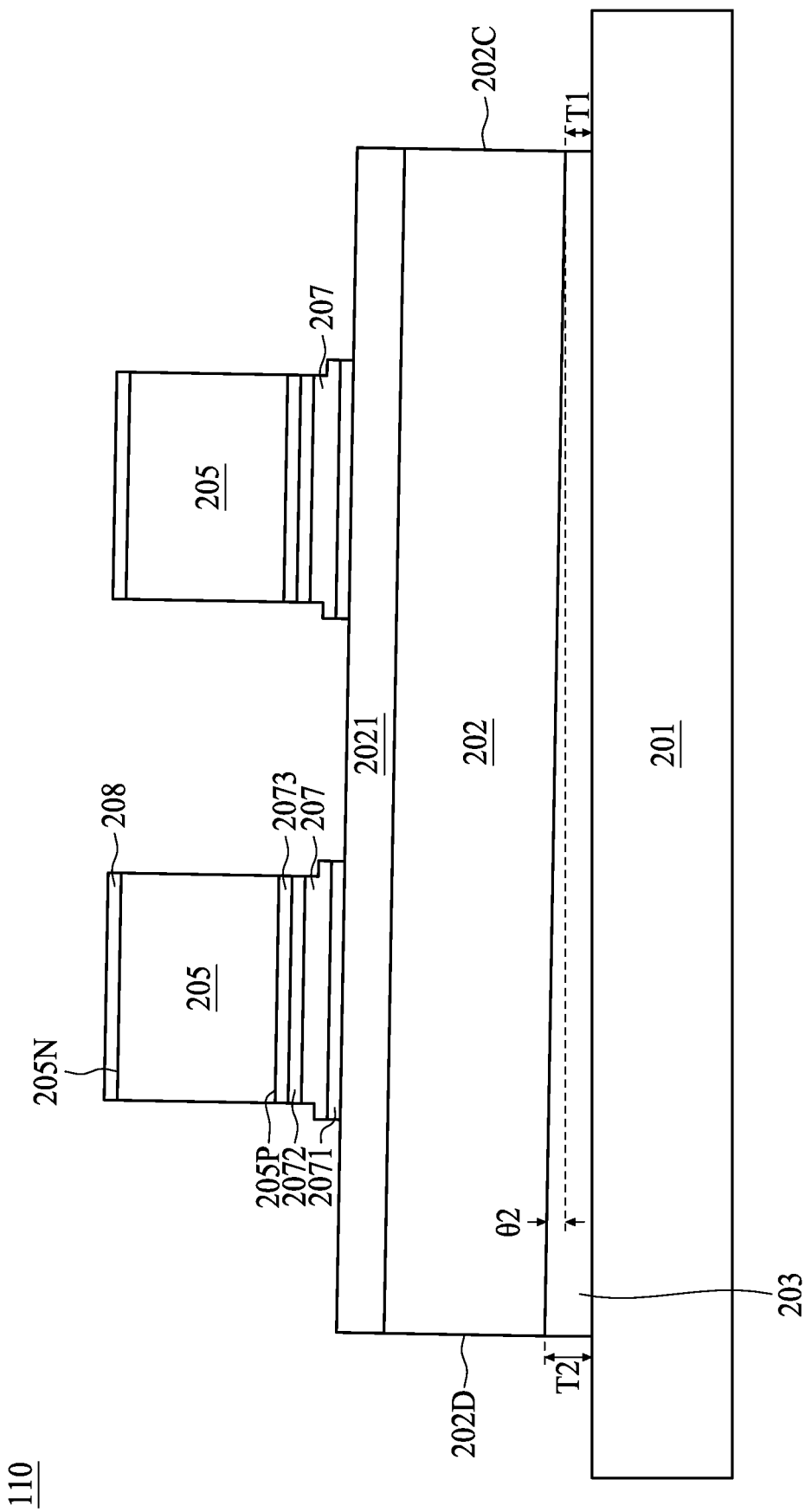

Referring to FIG. 11, FIG. 11 is a cross-sectional view of an optical package structure of FIG. 9 joined to a substrate 201 through a bonding layer 203. The bonding layer 203 can be a glue layer, a polymeric layer, or solder paste. The interposer 202 is disposed over the substrate 201 through a pick-and-place operation, followed by a curing operation to solidify the bonding layer 203. In FIG. 11, a thickness T1 of the bonding layer 203 at one edge 202C of the interposer 202 is different from a thickness T2 of the bonding layer 203 at an opposite edge 202D of the interposer 202, showing that the interposer and the optical devices or LD 205 tilt with respect to the substrate 201 after curing of the bonding layer 203. In some embodiments, the tilting angle θ2 of the interposer 202 with respect to the substrate 201 is less than 0.5 degree. As previously discussed, the tilting angle between the optical device or LD 205 and the interposer 202 is rather constrained and thus can be considered negligible.

Figure 12:
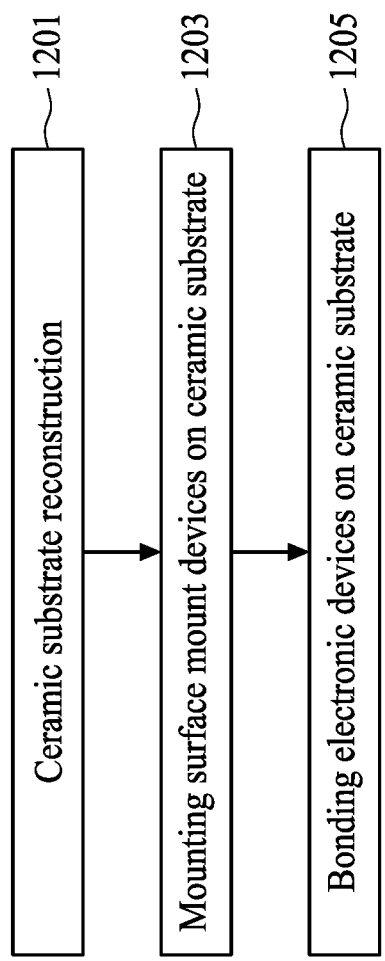
FIG. 12 is an operation flow for manufacturing an optical package structure, in accordance with some embodiments of the present disclosure.

Referring to FIG. 12, FIG. 12 is an operation flow for manufacturing an optical package structure, in accordance with some embodiments of the present disclosure. In operation 1201, a unit-level ceramic substrate is received, followed by ceramic reconstruction in order to form interconnect structure, such as redistribution layers in and exposed through a front surface of the ceramic substrate. In operation 1203 and referring to FIG. 4, surface mount devices or passive devices 402 and 404, such as capacitors, resistors, connectors or coils, are mounted over the ceramic substrate 401. In operation 1205, electronic devices or active devices 403 such as application-specific integrated circuit (ASIC), field-effect transistor (FET) or other components are bonded to the ceramic substrate 401. In some embodiments, electronic devices or active devices are formed at wafer level and have been taped, ground, and sawed. Depending on how the electronic devices or active devices are disposed on the ceramic substrate 401, solder reflow or die bond curing can be applied where suitable.

After disposing the passive and active devices over the ceramic substrate 401 and prior to forming a lid 501 covering the passive and active devices, an optical system 200 as shown and described in FIG. 2 or the light source 405 welded on the interposer 406 as shown and described in FIG. 4 can be disposed over an edge of the ceramic substrate 401. The position of the optical system 200 on the ceramic substrate 401 is not limited to the edge of the ceramic substrate 401 as long as the optical path emitted from or received by the optical devices 205 is not obstructed by other electronic or optical components.

Figure 13:
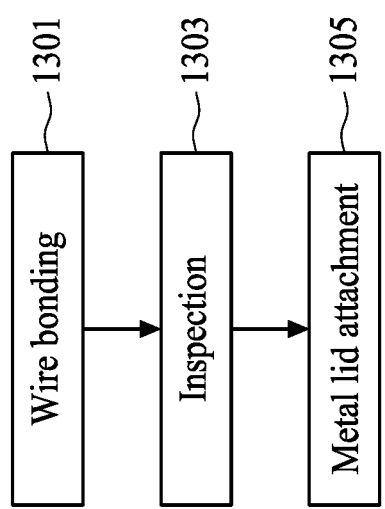
FIG. 13 is an operation flow for manufacturing an optical package structure, in accordance with some embodiments of the present disclosure.

Referring to FIG. 13, FIG. 13 is an operation flow for manufacturing an optical package structure, in accordance with some embodiments of the present disclosure. In operation 1301, electrical connections between the optical device 205 and the interposer 202 or the ceramic substrate 201 are established, for example, by a wire bonding operation. Referring back to FIG. 11, the conductive layer 208 is disposed at an n-type electrode 205N of the optical device of LD 205. The n-type electrode 205N is wire bonded to a contact pad (not shown) on the interposer 202 or a contact pad (not shown) on the ceramic substrate 201 through the conductive layer 208 by a wire bonding operation. In operation 1303, the optical system 400 and other electronic devices disposed on the ceramic substrate are inspected to identify packaging defects. Once inspection is passed, the metal lid 501 described in FIG. 5 is positioned to cover the optical system 400 by adhesive bonding or solder bonding. In the case of adhesive bonding, adhesive materials are dispensed on predetermined locations of the ceramic substrate 401, after the lid 501 is attached, and the adhesive materials are then cured. In the case of solder bonding, conductive patterns are formed at predetermined locations of the ceramic substrate 401, after the lid 501 is attached, and solder reflow is conducted to electrically connect the lid 501 and the ceramic substrate 401.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. An optical package structure, comprising:
a substrate having a first surface;
an interposer bonded to the first surface through a bonding layer, the interposer having a first area from a top view perspective; and
an optical device on the interposer, the optical device having a second area from the top view perspective, wherein the first area is greater than the second area;
wherein the interposer has a first end and a second end opposite to the first end, the bonding layer comprises a first portion and a second portion, the first portion is disposed under the first end of the interposer and having a first thickness, the second portion is disposed under the second end of the interposer and having a second thickness, and the first thickness is different from the second thickness.

2. The optical package structure of claim 1, wherein the bonding layer comprises flowable adhesive or solder paste.

3. The optical package structure of claim 1, further comprising a eutectic layer between the optical device and the interposer.

4. The optical package structure of claim 3, wherein the eutectic layer comprises a eutectic temperature greater than about 260 degrees Celsius.

5. The optical package structure of claim 4, further comprising a protection layer between the interposer and the eutectic layer.

6. The optical package structure of claim 1, further comprising a plurality of electronic devices electrically connected to the substrate.

7. The optical package structure of claim 1, wherein the substrate is composed of ceramic.

8. The optical package structure of claim 1, wherein the interposer is composed of material transparent to infra-red light.

9. The optical package structure of claim 1, wherein the interposer includes an interconnection structure.

10. The optical package structure of claim 1, wherein a width of the interposer is wider than a width of the optical device from a cross-sectional view perspective.

11. The optical package structure of claim 1, wherein a tilting angle of the interposer with respect to the substrate is less than about 0.0143 degrees.

12. An optical module, comprising:
a ceramic substrate;
a silicon interposer on the ceramic substrate;

a bonding layer between the ceramic substrate and the silicon interposer; and an optical device disposed on and electrically connected to the silicon interposer, wherein the silicon interposer has a first area from a top view perspective, and the optical device has a second area from the top view perspective, and wherein the first area is greater than the second area;

wherein the bonding layer comprises a first thickness at one end of the silicon interposer and a second thickness at an opposite end of the silicon interposer, the first thickness being different from the second thickness.

13. The optical module of claim 12, wherein the bonding layer comprises flowable adhesive or solder paste.

14. The optical module of claim 12, further comprising:
a eutectic layer between the silicon interposer and the optical device; and
a titanium layer between the eutectic layer and the optical device.

15. The optical module of claim 14, wherein the eutectic layer comprises AuSn, AuGe, AuSi, AlGe, or AlSi.

16. The optical module of claim 12, wherein the optical device comprises a light emitter or a light receiver.

17. The optical module of claim 12, further comprising an electrical device on the ceramic substrate.

18. The optical module of claim 17, further comprising a metal lid covering the optical device and the electrical device, wherein the metal lid electrically connects to the ceramic substrate.

19. The optical module of claim 12, wherein the silicon interposer includes an interconnection structure.

20. The optical module of claim 12, wherein a width of the silicon interposer is wider than a width of the optical device from a cross-sectional view perspective.

21. The optical module of claim 12, wherein a tilting angle of the silicon interposer with respect to the ceramic substrate is less than about 0.0143 degrees.

* * * * *